United States Patent [19]
LeRoy

[11] Patent Number: 6,046,781
[45] Date of Patent: Apr. 4, 2000

[54] AUTOMATIC FINE TUNING OF TV RECEIVER FOR RECEIVING BOTH DIGITAL AND ANALOG TV SIGNALS

[75] Inventor: Allen LeRoy, Fairfax County, Va.

[73] Assignee: SamSung Electronics Co., Ltd., Kyungki-do, Rep. of Korea

[21] Appl. No.: 08/822,736

[22] Filed: Mar. 24, 1997

Related U.S. Application Data

[60] Provisional application No. 60/034,610, Jan. 7, 1997.

[51] Int. Cl.$^7$ ..................................................... H04N 5/44
[52] U.S. Cl. ........................... 348/731; 348/725; 348/729; 348/735; 455/150.1; 455/182.3
[58] Field of Search ..................................... 348/725, 726, 348/729, 731, 735; 455/130, 150.1, 154.1, 180.3, 182.1–182.3, 192.1–193.1; H04N 5/44

[56] References Cited

U.S. PATENT DOCUMENTS

| | | | |
|---|---|---|---|
| 3,886,302 | 5/1975 | Kosco | 380/20 |
| 3,949,158 | 4/1976 | Rzeszewski et al. | 348/735 |
| 4,142,157 | 2/1979 | Tanaka | 455/182.3 |
| 4,249,259 | 2/1981 | Oda et al. | 455/182.3 |
| 4,298,988 | 11/1981 | Dages | 455/182.1 |
| 4,322,751 | 3/1982 | Hongu et al. | 348/735 |
| 4,398,303 | 8/1983 | Chin et al. | 455/168.1 |
| 4,434,439 | 2/1984 | Steckler et al. | 348/572 |
| 4,484,221 | 11/1984 | Tults | 348/731 |
| 4,485,404 | 11/1984 | Tults | 348/735 |
| 4,502,078 | 2/1985 | Steckler et al. | 348/727 |
| 4,503,465 | 3/1985 | Wine | 348/735 |
| 4,599,652 | 7/1986 | Carlson | 348/735 |
| 4,600,924 | 7/1986 | Lobsinger et al. | 342/98 |
| 4,686,570 | 8/1987 | Lewis, Jr. et al. | 348/725 |
| 5,331,290 | 7/1994 | Harford et al. | 330/254 |
| 5,390,348 | 2/1995 | Magin et al. | 455/63 |
| 5,404,161 | 4/1995 | Douglass et al. | 348/1 |
| 5,507,025 | 4/1996 | Rodeffer | 455/266 |
| 5,510,859 | 4/1996 | Douglass et al. | 348/731 |
| 5,565,932 | 10/1996 | Citta et al. | 348/678 |
| 5,600,680 | 2/1997 | Mishima et al. | 375/327 |
| 5,737,035 | 4/1998 | Rotzoll | 348/725 |
| 5,739,874 | 4/1998 | Badger et al. | 348/731 |
| 5,748,046 | 5/1998 | Badger | 331/17 |

*Primary Examiner*—Michael H. Lee
*Assistant Examiner*—Jean W. Désir
*Attorney, Agent, or Firm*—Robert E. Bushnell, Esq.

[57] ABSTRACT

Radio receivers for receiving ATSC DTV signals or NTSC analog TV signals each use a single first detector for both types of signal that supplies its output signals to an intermediate-frequency amplifier chain for DTV signals and to another intermediate-frequency amplifier chain for analog TV signals. In some receivers the sound carrier of the NTSC signal has a separate, further IF amplifier chain. When DTV signals are determined to be received, or alternatively when analog TV signals are determined not to be received, the first detector is conditioned for automatic fine tuning in response to the pilot carrier of received DTV signal. When DTV signals are determined not to be received, or alternatively when analog TV signals are determined to be received, the first detector is conditioned for automatic fine tuning in response to the video carrier of received analog TV signal. The determination of whether or not DTV signal is received is made in response to the amplitude of DTV signal pilot carrier. The determination of whether or not DTV signal is received is made in response to the amplitude of analog TV signal video carrier or in response to the amplitude of intercarrier sound IF signal.

22 Claims, 8 Drawing Sheets

AUTOMATIC FINE TUNING OF TV RECEIVER FOR RECEIVING BOTH DIGITAL AND ANALOG TV SIGNALS

This application is filed under 35 U.S.C. 111(a) claiming pursuant to 35 U.S.C. 119(e)(1) benefit of the filing date of provisional application serial No. 60/034,610 filed Jan. 7, 1997, pursuant to 35 U.S.C. 111(b).

The invention relates to the radio receiver portions of television (TV) signal receivers for receiving terrestrial through-the-air television broadcasting in the United States of America whether the received signals be digital television signals, in accordance with the Advanced Television Systems Committee (ATSC) standard, or analog television signals, in accordance with the National Television Systems Committee (NTSC) standard. More particularly, the invention relates to providing fine-tuning signals to the first detector in those radio receiver portions.

BACKGROUND OF THE INVENTION

The first detector in a television signal receiver converts radio-frequency (RF) signals in a selected one of the television broadcast channels, which channels occupy various 6-MHz-wide portions of the electromagnetic wave frequency spectrum, to an intermediate-frequency (IF) signals in one particular 6-MHz-wide portion of that spectrum. This conversion is typically carried out by superheterodyning the RF signals, which is to say mixing the RF signals with local oscillations from a first local oscillator oscillating at a frequency substantially higher than the frequencies in the television channel of highest frequency, which mixing is done by linear multiplication in a first mixer. The first mixer is preferably of doubly balanced type. The first detector is used to convert a selected RF signal to IF signal in order that up to 60 dB or more amplification can be done in that particular 6-MHz-wide portion of that spectrum using IF amplifiers with fixed, rather than variable, tuning. Amplification of the received signals is necessary to raise them to power levels required for further signal detection operations, such as video detection and sound detection in the case of analog TV signals, and such as symbol decoding in the case of digital TV signals. The first detector usually includes variable tuning elements in the form of preselection filter circuitry for the RF signals to select among the various 6-MHz-wide television channels and in the further form of elements for determining the frequency of the local oscillations used for super-heterodyning the RF signals.

In analog TV signal receivers, which generally employ single-conversion radio receivers, the frequency of the oscillations supplied by the first local oscillator is often fine-tuned in response to an electric fine-tuning signal. This fine-tuning signal is generated by an automatic fine-tuning (AFT) feedback loop, which includes a bandpass filter responsive to the video carrier component of an IF amplifier response and an AFT detector that generates the electric fine-tuning signal. The AFT detector typically includes a limiter amplifier and a frequency discriminator tuned for prescribed video carrier frequency as translated to IF by the first detector. AFT is done to adjust the IF signal, so that the frequency-modulated (FM) audio carrier component of the selected TV channel as it appears in the amplified IF signal supplied to the video detector falls into the in-channel sound trap filter, and so that the FM audio carrier of an adjacent TV channel next below in frequency as it appears in the amplified IF signal supplied to the video detector falls into the adjacent-channel sound trap filter. Also, the IF amplifier amplitude response is rolled off 6 dB at video carrier frequency to provide matched filtering for the vestigial sideband (VSB) filter in the analog TV transmitter, so the IF signal should be aligned so this amplitude equalization is correctly performed.

In some analog TV receivers of recent design first local oscillator signals are generated using a frequency synthesizer in which the first local oscillator signals are generated with frequency regulated in adjustable offset from the fixed frequency of a standard oscillator. This is advantageous if the frequency of the first local oscillations is to be fine-tuned in response to an electric fine-tuning signal, since electric fine-tuning of the frequency of the standard oscillator can be done (e. g., by using a varactor diode in an LC tank circuit) with the sensitivity of absolute frequency adjustment of first local oscillations to electric fine-tuning signal being constant no matter what the nominal frequency of the first local oscillator signals is.

DTV receivers known in the prior art have not used AFT of the first local oscillator. The data carrier of the VSB signal is located 310 kHz from the lower limit frequency of the 6 MHz TV broadcast channel, and the uppermost sideband extends to 310 kHz from the lower limit frequency of the 6 MHz TV broadcast channel. The IF amplifier bandwidths have been 6 MHz wide with less than a 1 dB ripple in amplitude response across the passband, so critical (fine) tuning has not been required. However, the inventor points out, the introduction of in-channel and adjacent-channel sound trap filtering into the IF amplifier chain of an DTV receiver is advantageous in reducing the artifacts of NTSC signal interference that will, during a transition era in which DTV broadcasting is done while analog TV broadcasting continues still to be done, accompany symbol codes recovered in a DTV receiver. If such sound trap filtering is introduced into the IF amplifier chain amplifying DTV signals, it becomes advantageous to use AFT of the first local oscillator in a DTV receiver during the reception of DTV signals.

Television signal receivers capable of receiving both digital television (DTV) signals transmitted in accordance with the ATSC broadcast standard and analog TV signals transmitted in accordance with the NTSC broadcast standard are described in the inventor's U.S. patent application Ser. Nos. 08/825,711, 08/820,193, filed Mar. 19, 1997 and respectively entitled RADIO RECEIVER DETECTING DIGITAL AND ANALOG TELEVISION RADIO-FREQUENCY SIGNALS WITH SINGLE FIRST DETECTOR and DIGITAL-AND-ANALOG-TV-SIGNAL RECEIVERS, EACH WITH SINGLE FIRST DETECTOR AND SHARED HIGH-BAND I-F AMPLIFICATION. These applications are incorporated herein by reference for providing details of receiver construction not directly related to developing and utilizing automatic fine-tuning signals. The TV receivers described in these applications are of plural-conversion type, each using a single first detector both DTV signals and analog TV signals. The first detector generates ultra-high-frequency (UHF) intermediate-frequency signals. There are differing requirements for IF amplification of DTV signals and IF amplification of analog TV signals, so each of these TV receivers uses different IF amplifier chains for analog TV signals and for DTV signals. In some of these TV receivers the different IF amplifier chains for analog TV signals and for DTV signals do share some IF amplifier stages, however. The first detector generates ultra-high-frequency (UHF) intermediate-frequency signals which are subjected to frequency-selective filtering with bandwidth(s) just sufficient to pass the broadcast signal that is currently selected for reception, so automatic fine tuning (AFT) of first local oscillator signal is a practical necessity. When a single first detector is used both for DTV signal reception and for analog TV signal reception, problems of how properly to develop AFT signals arise.

The derivation of AFT signals from the response of the IF amplifier chain for the amplitude-modulated NTSC video carrier is known from experience in analog TV signal receiver design to have problems, which problems arise owing to the 6 dB rolloff of video carrier that is customary for match filtering the vestigial sideband filter at the transmitter and at the same time helping in the design of the adjacent channel sound trapping. Accordingly, in an analog TV signal receiver design using a quasi-parallel IF amplifier chain for intercarrier sound, the bandpass filter for selecting video carrier to the AFT detector is connected to receive the response of the quasi-parallel IF amplifier chain, rather than the response of the IF amplifier chain for the amplitude-modulated NTSC video carrier supplied to the video detector.

SUMMARY OF THE INVENTION

In a receiver designed for DTV reception, the IF amplifier chain for the VSB data modulation has flat amplitude response over most of the 6 MHz channel, except possibly for in-channel sound trapping to reduce the errors in data-slicing attributable to the undesired presence of the frequency-modulated (FM) audio carrier of an NTSC co-channel interfering signal. This flat amplitude response extends over a frequency band which includes the pilot carrier of a DTV signal selected for reception, which pilot carrier is selected to an AFT detector that is tuned to the prescribed frequency for the pilot carrier as translated to intermediate frequency and that fine-tunes the first local oscillator during DTV signal reception according to a first aspect of the invention.

In a receiver designed for analog TV reception as well as DTV reception, the flat amplitude response of the the IF amplifier chain for the VSB data modulation also includes the video carrier of an analog TV signal selected for reception, which video carrier is selected to a AFT detector that is tuned to the prescribed frequency for the video carrier as translated to intermediate frequency and that fine-tunes the second local oscillator during analog TV signal reception. Another aspect of the invention is, when deriving AFT signal for a local oscillator during analog TV signal reception, the response of the IF amplifier chain designed for amplifying VSB data modulation during DTV signal reception.

Another aspect of the invention concerns elegantly solving the problem of getting enough gain for generating AFT signals for the first local oscillator in a plural-conversion receiver. Obtaining high gain at the UHF intermediate frequencies is undesirable from the standpoint of AFT loop stability, and the control of gain for data signals is better accomplished at the VHF intermediate frequencies generated by the second detector. In the second detector a second local oscillator, such as a crystal-controlled oscillator, supplies second local oscillations of predetermined fixed frequency to a second mixer used to heterodyne the UHF intermediate frequencies to VHF intermediate frequencies for amplification. The pilot carrier component of amplified VHF intermediate frequencies are selected by a first bandpass filter to a first AFT detector for fine-tuning the first local oscillator during DTV signal reception. The stable, fixed frequency of the second oscillator causes AFT signals developed in response to amplified VHF intermediate frequencies to accurately regulate the AFT of the first local oscillator so as to align UHF intermediate frequencies from the first detector with the frequency-selective filters in the UHF IF amplifier. This is because the stable, fixed frequency of the second oscillator causes the frequency error in the amplified VHF intermediate frequencies from the second mixer to track precisely the frequency error in the amplified UHF intermediate frequencies to the second mixer.

Still further aspects of the invention concern how to select proper fine-tuning signal for the first local oscillator in a TV receiver that is designed for analog TV reception as well as DTV reception, that has a first detector for fine-tuning the first local oscillator during DTV signal reception, and that has a second AFT detector for fine-tuning the first local oscillator during analog TV signal reception.

BRIEF DESCRIPTION OF THE DRAWING

Each of FIGS. 1, 2, 3, 4, 5, 6 and 7 is a schematic diagram of some of the radio receiver portions of a television receiver capable of receiving either analog TV signals or digital TV signals, which radio receiver portions include a first detector, an IF amplifier chain designed for amplifying DTV signals, circuitry for synchrodyning the amplified DTV signals to baseband for recovering symbol codes, and AFT circuitry for a first local oscillator within the first detector, which AFT circuitry embodies the invention in various forms.

DETAILED DESCRIPTION

Figure 1:
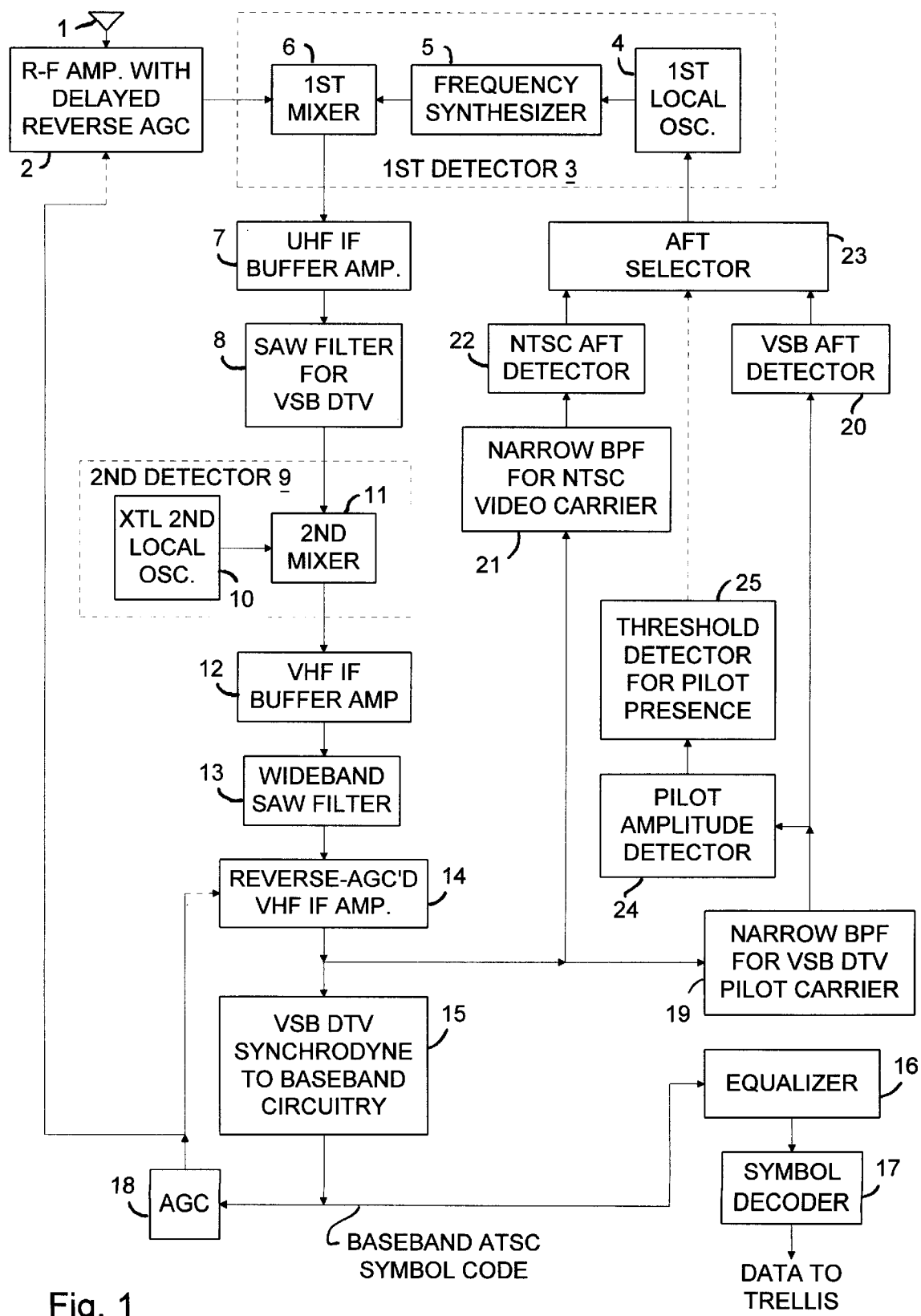
FIG. 1 shows the AFT circuitry including an AFT selector, which AFT selector selects AFT signal from an AFT detector tuned to DTV pilot frequency when a threshold detector senses the presence of DTV pilot carrier in the response of a pilot amplitude detector amplitude, and which AFT selector otherwise selects AFT signal from an AFT detector tuned to NTSC video carrier frequency.

FIG. 1 shows some of the radio receiver portions of a television receiver capable of receiving either analog TV signals or digital TV signals. These radio receiver portions include the first detector and the IF amplifier chain designed for amplifying DTV signals. An antenna I is a representative source of television signals in the very high frequency (VHF) and ultra high frequency (UHF) bands for application to a radio-frequency (RF) amplifier 2. The RF amplifier 2 is provided with a tracking preselection filter for selecting a portion of the one of the television broadcast bands the television signal selected for reception reposes in. The RF amplifier 2 supplies amplified response to the television signal selected for reception. This amplified response is supplied to a first detector 3 that comprises a first local oscillator 4 with automatic fine tuning, a frequency synthesizer 5 for generating super-heterodyning signal of a frequency in selected offset from the frequency of the first local oscillator, and a first mixer 6 for mixing the selected radio-frequency signal with the super-heterodyning signal to generate a UHF intermediate-frequency signal. The first mixer 6 includes an image-suppression filter, not explicitly shown in FIG. 1, for suppressing the image of that IF signal in its output signal and is preferably of a doubly-balanced linear-multiplication type. The image-suppression filter is typically a broadband coupling network including capacitors and inductors, which network provides a bandpass response. The first detector 3 translates the 6-MHz-wide selected radio-frequency signal so as to be nominally centered at an ultra-high frequency above that portion of the UHF band containing assigned channels for television broadcasting, placing the image frequencies well above 1 GHz so they are easily rejected by a bandpass coupling network. That is, the first detector 3 can by way of example be similar to prior-art first detectors in plural-conversion digital high-definition digital television (HDTV) receivers used by the Grand Alliance during field testing of terrestrial over-the-air HDTV broadcasting in accordance with the ATSC standard, with the UHF IF signal being centered at 920 MHz.

The UHF IF signal supplied from the first detector 3 is applied via a buffer amplifier 7 to a surface-acoustic-wave filter 8 having a substantially linear-phase response and having an amplitude response that has a bandwidth of 5.7–6.0 MHz. This can be a flat-amplitude response having a –1 dB to –1dB bandwidth of 5.7–6.0 MHz, to reduce the need for amplitude equalization after reproducing baseband symbol codes. The buffer amplifier 7 provides fixed gain to make up the 10–12 dB insertion loss of the SAW filter 8 and drives the SAW filter 8 from a fixed source impedance chosen to avoid unwanted reflections.

Figure 8:
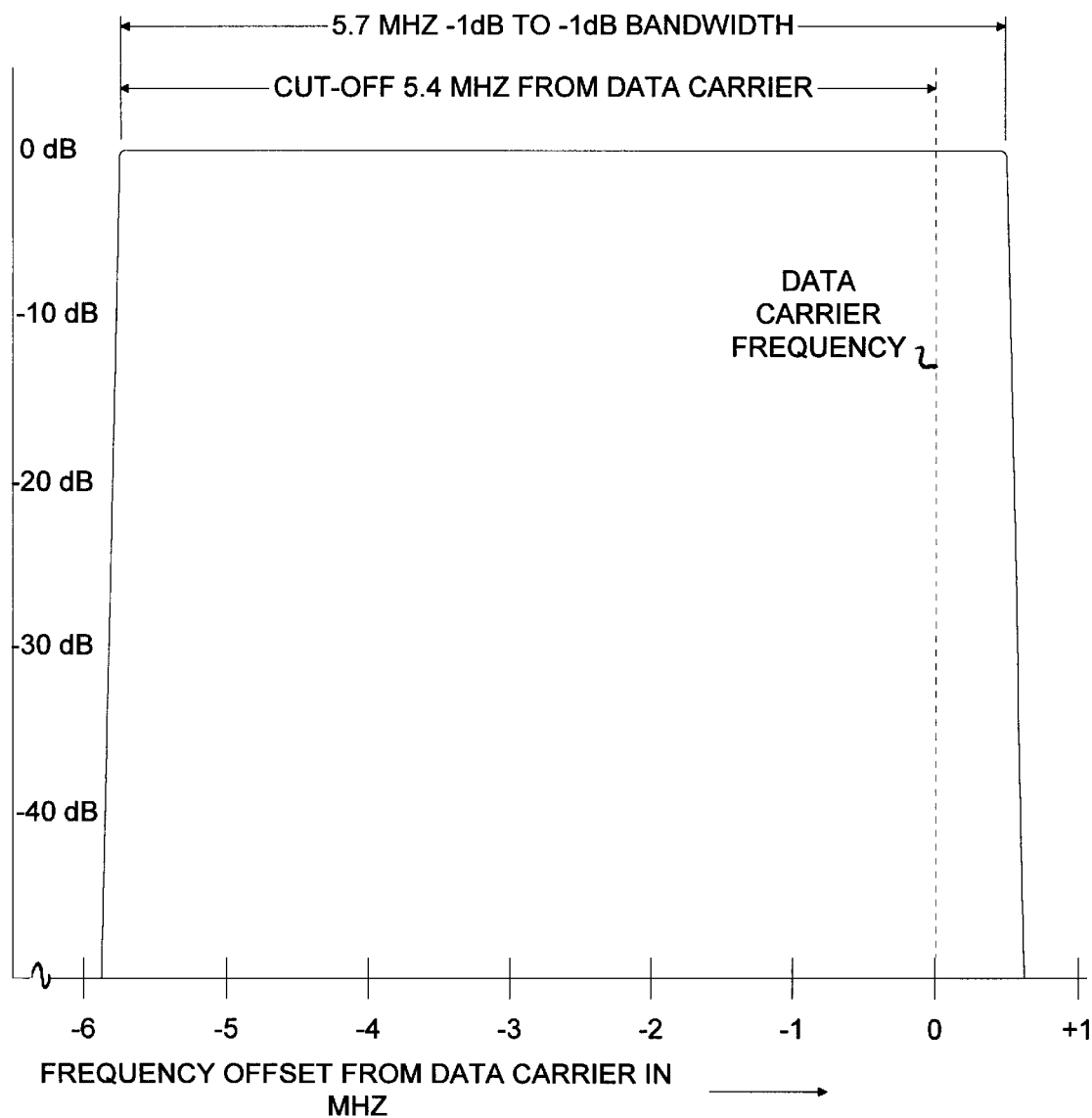
FIG. 8 is a graph of an ideal response for a bandpass filter used in the IF amplifier chain for DTV in the radio receiver portions of a TV receiver shown in any one of the FIGS. 1, 2, 3, 4, 5, 6 and 7.

FIG. 8 shows the amplitude response portion of a preferred ideal transfer characteristic for the SAW filter 8; the phase response portion of an ideal transfer characteristic for the SAW filter 8 is linear-phase throughout the passband. The ideal characteristic can be closely matched in actual practice, with some minor ripples in the passband. The SAW filter 8 cuts off rapidly just beyond 5.38 MHz remove from the suppressed carrier frequency and the pilot carrier, which is of like frequency and of fixed amplitude. This rapid cut-off can be achieved using trap filtering for the sound IF, with SAW filter 8 response exhibiting reduced attenuation at frequencies more than 5.85 MHz below data carrier frequency as translated to the UHF IF band. In any case, the SAW filter 8 rejects the frequency-modulated sound carrier of any co-channel interfering analog TV signal.

FIG. 8 shows that the SAW filter 8 cuts off rapidly approaching the edge of the UHF IF band which edge is 310 kHz above data carrier frequency as translated to that UHF IF band. The VSB signal used for DTV differs from that used in analog TV transmission in that the roll-off of the vestigial sideband begins at frequencies below the data carrier frequency rather than above the carrier frequency. Accordingly, there is no need or desire to have –6 dB roll-off at the data carrier frequency as translated to the UHF IF band. This facilitates the SAW filter 8 maintaining better phase linearity through the frequency range surrounding data carrier frequency.

A second detector 9 comprises a second local oscillator 10 for generating UHF second local oscillations and a second mixer 11 for mixing those second local oscillations with the SAW filter 8 response. The second local oscillator 10 is preferably a crystal-controlled oscillator generating UHF second local oscillations of fixed frequency. The second detector 9 downconverts the SAW filter 8 response to generate a very-high-frequency intermediate-frequency signal, applied via a buffer amplifier 12 to a surface-acoustic-wave filter 13. The buffer amplifier 12 provides fixed gain to make up the 15–17 dB insertion loss of the SAW filter 13 and drives the SAW filter 13 from a fixed source impedance chosen to avoid unwanted reflections. The second mixer 11 is a linear multiplier, and its design can be such as to eliminate the need for the ensuing buffer amplifier 12 before the SAW filter 13. The SAW filter 13 has a substantially linear-phase, flat-amplitude response over a bandwidth in excess of 6 MHz.

The SAW filter 8, rather than the SAW filter 13, is preferred for determining overall receiver response. The SAW filtering to define receiver bandwidth can be more easily implemented in a UHF band than in a VHF band, as long as care is taken to drive the SAW filter from the optimal source impedance specified by its manufacturer. This is because the $\Delta f/f$ ratio of 6 MHz to UHF midband frequency is substantially lower than the $\Delta f$ ratio of 6 MHz to VHF midband frequency. The SAW filter 13 eliminates the image of the VHF IF signal in its response applied to a plural-stage intermediate-frequency amplifier 14 as input signal thereto.

Synchrodyning circuitry 15 synchrodynes the amplified VHF IF signal supplied as output signal intermediate-frequency amplifier 14 to baseband, for reproducing baseband ATSC symbol codes supplied to an equalization filter 16 and thencefrom to a symbol decoder 17. A symbol decoder preferred by the inventor at the time of filing application for patent is described in his U.S. U.S. Pat. No. 5,748,226 issued May 5, 1998, entitled DIGITAL TELEVISION RECEIVER WITH ADAPTIVE FILTER CIRCUITRY FOR SUPPRESSING NTSC CO-CHANNEL INTERFERENCE and incorporated herein by reference. U.S. Pat. No. 5,479,449 describes the synchrodyning circuitry 15 as including circuitry for converting the amplified second IF signal to a final IF signal somewhere in a 1–8 MHz band, an analog-to-digital converter for digitizing the final IF signal, and digital circuitry for completing the synchrodyne to baseband in the digital regime. Alternatively, as in the receivers used by the Grand Alliance during HDTV field testing, the synchrodyning circuitry 15 can be operative in the analog regime, with the analog baseband signal being digitized by an analog-to-digital converter for application to the equalizer circuitry 16. The equalizer circuitry 16 is then cascaded with a phase tracker operative at baseband.

Automatic gain control circuitry 18 responds to the baseband ATSC symbol codes for generating reverse AGC signals for stages in the IF amplifier 14 and a delayed reverse AGC signal for the RF amplifier 2. Reverse AGC is favored for maintaining linearity of the amplifier stages having controlled gain. Providing most of the controlled gain in the receiver in the VHF IF amplifier stages is preferred since stray capacitance interferes less with high gain per stage and with reducing the gain per stage. Modem VHF IF amplifier design relies on the input SAW filter for selectivity, the remainder of the amplifier being wideband. A suitable wideband amplifier having controlled gain is described by J. R. Harford et alii in U.S. Pat. No. 5,331,290 issued Jun. 19, 1994, entitled VARIABLE GAIN AMPLIFIER and incorporated herein by reference. The gain of the RF amplifier 2 is controlled to avoid non-linear multiplication by the first mixer 6 when very strong RF input signals are received.

The AGC circuitry 18 can take any of a number of known forms. In early Grand Alliance receivers the AGC circuitry for DTV signals used a matched filter responsive to data segment code groups, and of the response of this matched filter was peak detected to develop a basic AGC signal which was then use to develop delayed AGC for the IF amplifier stages. An AGC that responds to average symbol value can be used, as described by Citta et alii in U.S. Pat. No. 5,565,932 entitled AGC SYSTEM WITH PILOT USING DIGITAL DATA REFERENCE. U.S. Pat. No. 5,636,252 issued Jun. 3, 1997 by C. B. Patel and the inventor, entitled AUTOMATIC GAIN CONTROL OF RADIO RECEIVER FOR RECEIVING DIGITAL HIGH-DEFINITION TELEVISION SIGNALS describes AGC circuitry that detects the direct component of the baseband signal generated by synchrodyning the pilot carrier to baseband during the reception of DTV signals.

In selective response to the amplified VHF IF signal that the intermediate-frequency amplifier 14 supplies as its output signal, a bandpass filter 19 applies to an automatic fine tuning detector 20 tuned for the frequency of the DTV pilot carrier (as translated to VHF intermediate frequency) a narrow band of frequencies including the nominal frequency of the DTV pilot carrier (as translated to VHF intermediate frequency). The AFT detector 20 develops an AFT signal in response to the DTV pilot carrier when the TV receiver receives a DTV signal of substantial strength.

In selective response to the amplified VHF IF signal that the intermediate-frequency amplifier 14 supplies as its output signal, a bandpass filter 21 applies to an automatic fine tuning detector 22 tuned for the frequency of the NTSC video carrier (as translated to VHF intermediate frequency) a narrow band of frequencies including the nominal frequency of the NTSC video carrier (as translated to VHF intermediate frequency). The AFT detector 22 develops an AFT signal in response to the NTSC video carrier when the TV receiver receives an analog TV signal of substantial strength.

If the AFT detector 20 is non-responsive in the absence of the DTV pilot carrier and if the AFT detector 22 is non-responsive in the absence of the NTSC video carrier, their output signals can simply be summed to generate the automatic fine-tuning signal applied to the first local oscillator 4. Preferably, an automatic fine-tuning signal selector 23 is employed to apply the AFT signal from the AFT detector 20 to the first local oscillator 4 when a DTV signal is currently being received or to apply the AFT signal from the AFT detector 22 to the first local oscillator 4 when an analog TV signal is currently being received.

In FIG. 1 the AFT signal selector 23 is controlled by means for determining when the TV signal currently being received is a VSB DTV signal, the TV signal currently being received otherwise being presumed to be an analog TV signal. FIG. 1 shows one form of such means, which comprises an amplitude detector 24 for detecting the amplitude of pilot carrier as translated to intermediate frequency in the selective response of the bandpass filter 19 and a threshold detector 25 responsive to the detected amplitude exceeding a prescribed threshold value for determining that the TV signal currently being received is a digital television signal.

Figure 2:
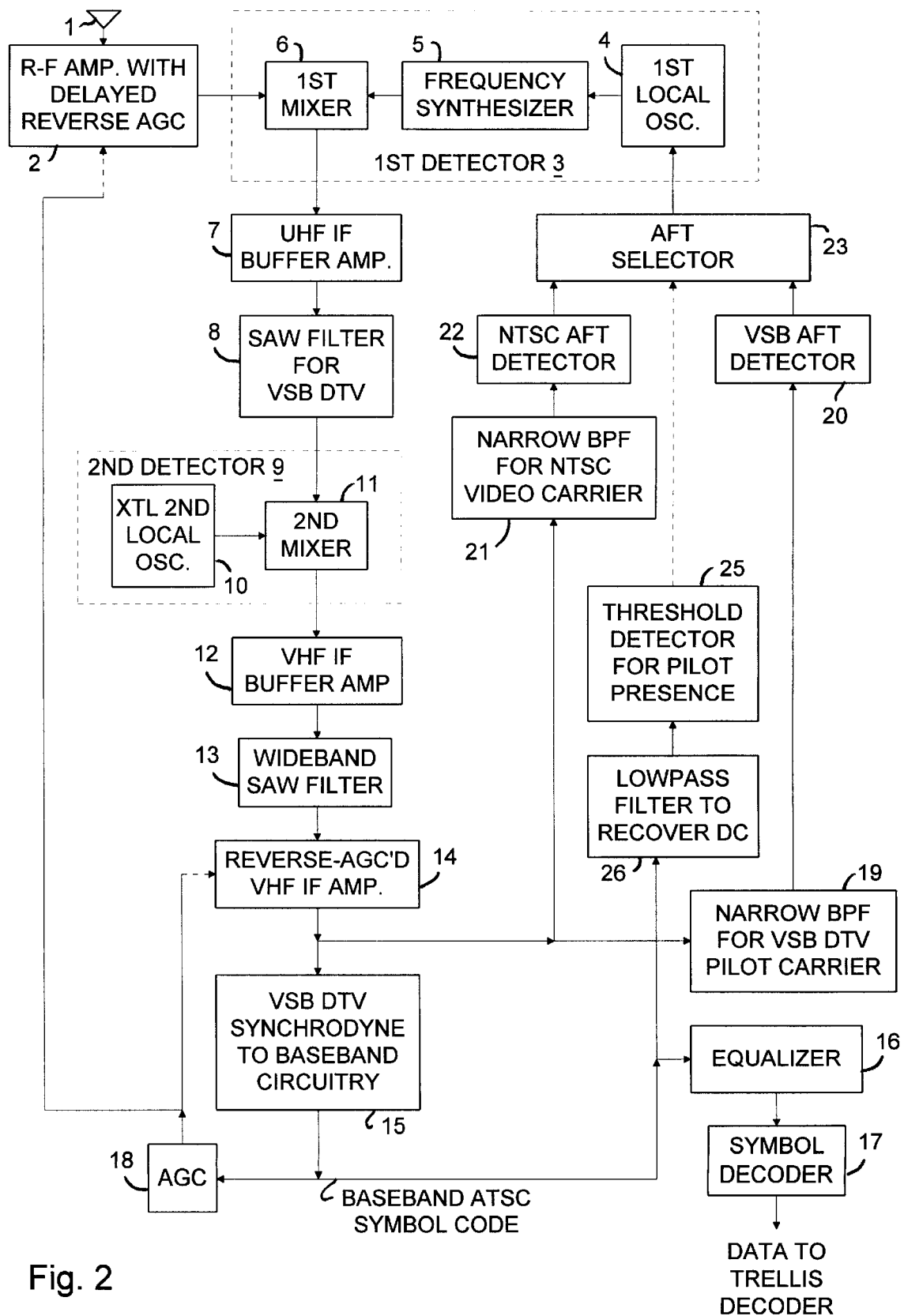
FIG. 2 shows the AFT circuitry including an AFT selector, which AFT selector selects AFT signal from an AFT detector tuned to DTV pilot frequency when a threshold detector senses the presence of a direct component accompanying baseband DTV symbol coding as reproduced in the receiver, and which AFT selector otherwise selects AFT signal from an AFT detector tuned to NTSC video carrier frequency.

FIG. 2, like FIG. 1, shows some of the radio receiver portions of a television receiver capable of receiving either analog TV signals or digital TV signals. In FIG. 2 the AFT signal selector 23 is also controlled by means for determining when the TV signal currently being received is a VSB DTV signal, but an alternative form of this means, which comprises a lowpass filter 26 for separating the direct component of the baseband ATSC symbol coding reproduced by the synchrodyning circuitry 15 and the threshold detector 25 responsive to the direct component exceeding a prescribed threshold value for determining that the TV signal currently being received is a digital television signal. The direct component accompanying the baseband ATSC symbol coding reproduced by the synchrodyning circuitry 15 is attributable to synchronous detection of the DTV pilot carrier signal.

Figure 3:
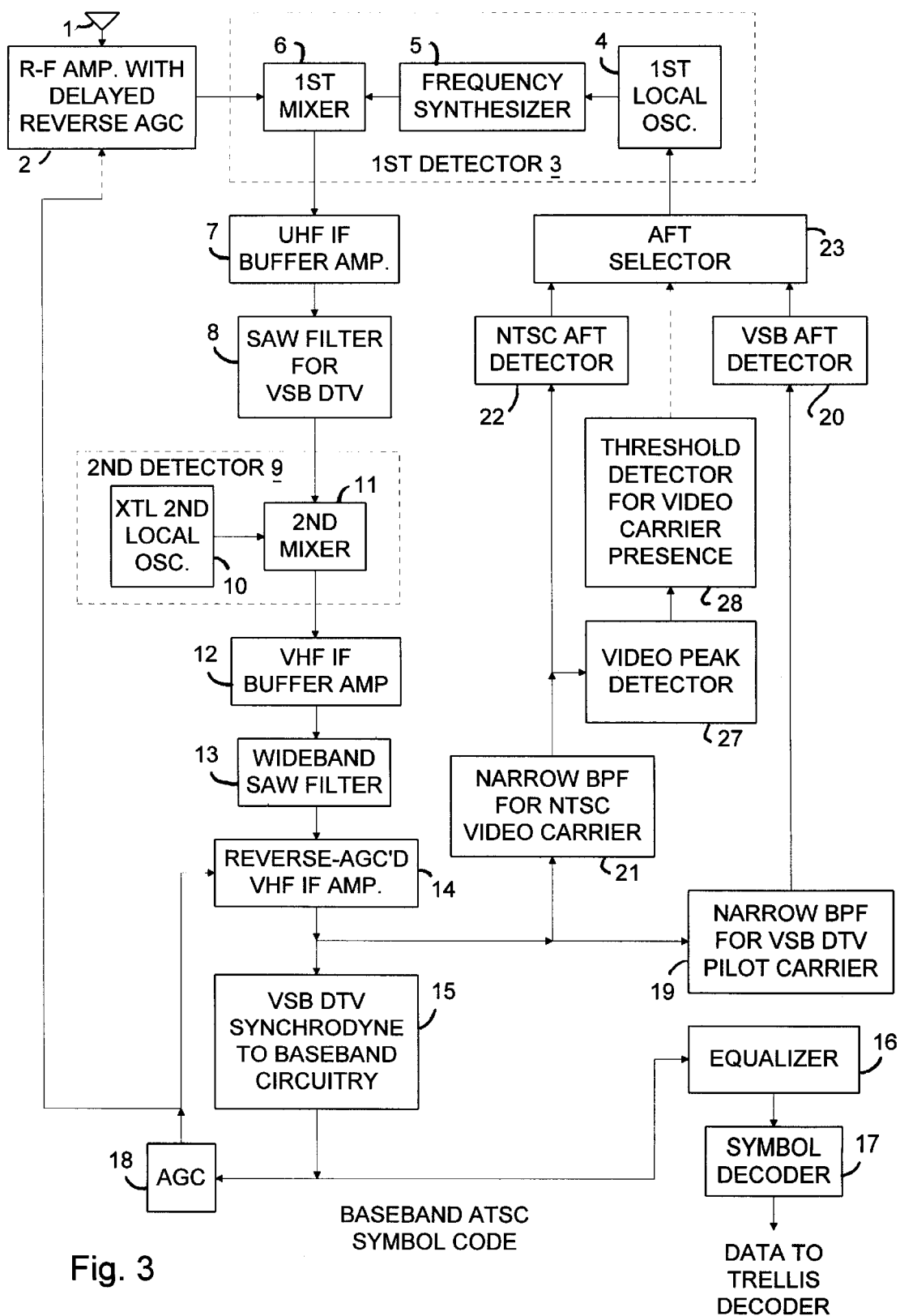
FIG. 3 shows the AFT circuitry including an AFT selector, which AFT selector selects AFT signal from an AFT detector tuned to video carrier frequency when a threshold detector senses the presence of video carrier in the response of a video peak detector, and which AFT selector otherwise selects AFT signal from an AFT detector tuned to DTV pilot frequency.

FIG. 3, like FIGS. 1 and 2, shows some of the radio receiver portions of a television receiver capable of receiving either analog TV signals or digital TV signals. In FIG. 3, however, the AFT signal selector 23 is controlled by means determining when the TV signal currently being received is an analog TV signal, the TV signal currently being received otherwise being presumed to be a VSB DTV signal. This means comprises a video peak detector 27 for detecting the peak excursion of the video carrier response of the bandpass filter 21 and a threshold detector 28 responsive to the detected peak excursion exceeding a prescribed threshold value for determining that the TV signal currently being received is an analog television signal.

Figure 4:
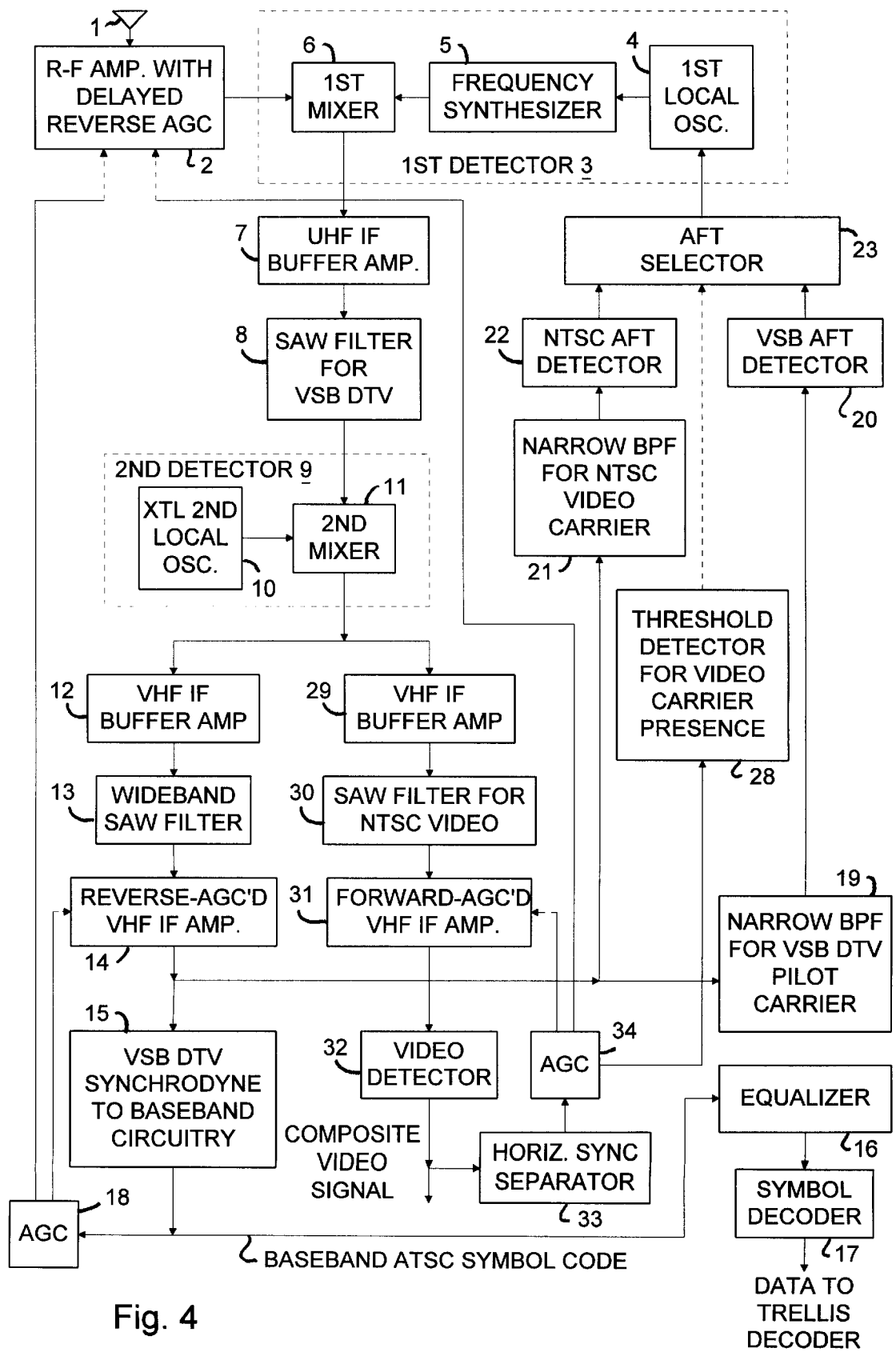
FIG. 4 shows the AFT circuitry including an AFT selector, which AFT selector selects AFT signal from an AFT detector tuned to video carrier frequency when a threshold detector senses the presence of video carrier from automatic gain control circuitry of an IF amplifier chain for amplifying NTSC video carrier modulation, and which AFT selector otherwise selects AFT signal from an AFT detector tuned to DTV pilot frequency, the IF amplifier chain for amplifying NTSC video carrier modulation sharing a UHF IF amplifier and second mixer with the IF amplifier chain for amplifying DTV modulation.
Figure 5:
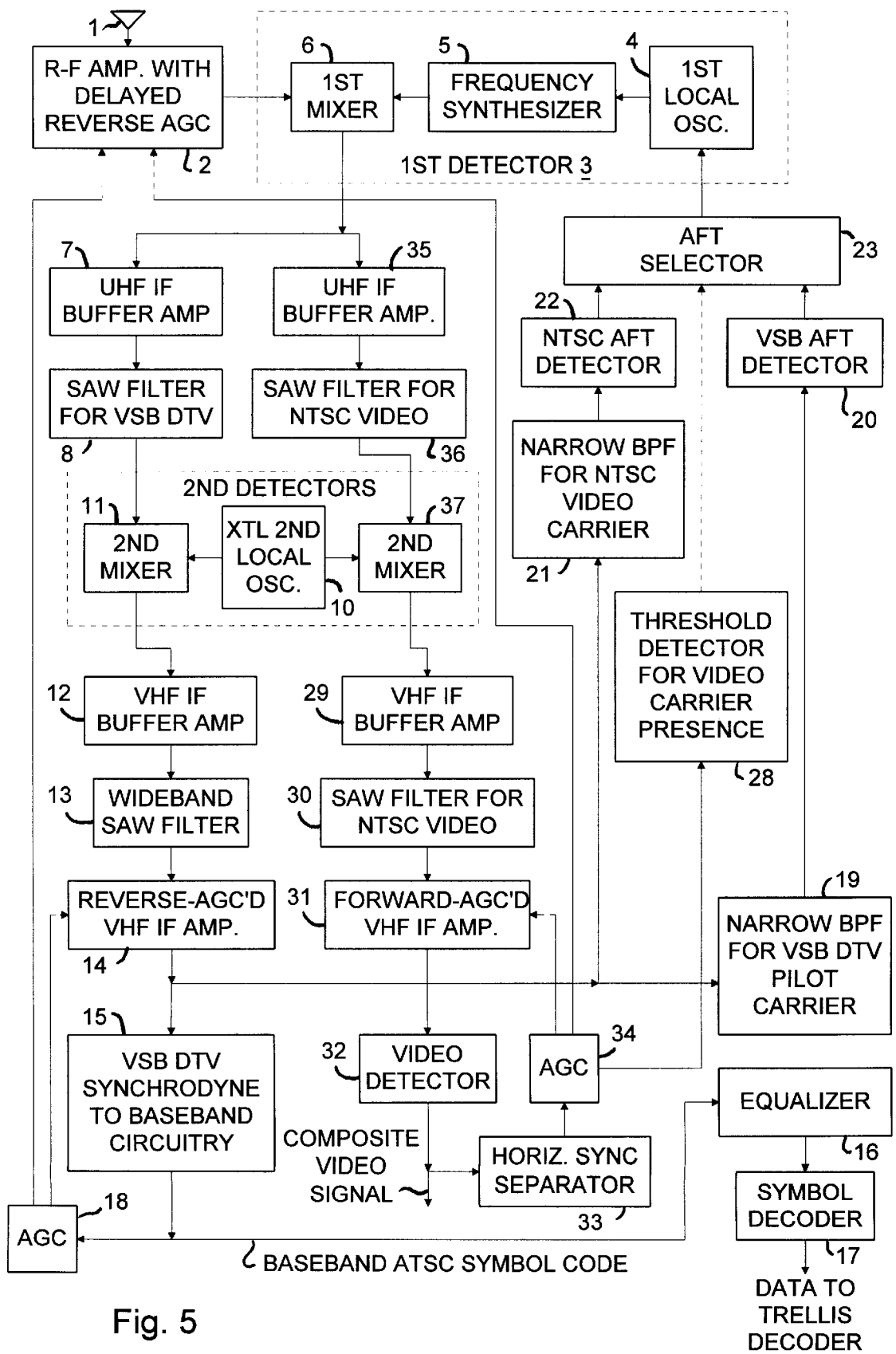
FIG. 5 shows the AFT circuitry including an AFT selector, which AFT selector selects AFT signal from an AFT detector tuned to video carrier frequency when a threshold detector senses the presence of video carrier from automatic gain control circuitry of an IF amplifier chain for amplifying NTSC video carrier modulation, and which AFT selector otherwise selects AFT signal from an AFT detector tuned to DTV pilot frequency, the IF amplifier chain for amplifying NTSC video carrier modulation being separate from the IF amplifier chain for amplifying DTV modulation except for sharing a common second local oscillator.

The peaks of video carrier modulation can be sensed at other points in the TV receiver than at the bandpass filter 21 output port, thereafter to be supplied to the threshold detector 28 responsive to the detected peak excursion exceeding a prescribed threshold value for determining that the TV signal currently being received is an analog television signal. For example, the NTSC video detector used during NTSC reception supplies baseband composite video signal to the horizontal synchronization detector, and the amplitudes of separated horizontal synchronizing pulses are detected by an automatic gain control (AGC) detector for developing automatic gain control signals for the forward-AGC'd VHF IF amplifiers used for NTSC signals. The AGC detector can be used for supplying the threshold detector 28 what is in effect peak detected video signal. FIGS. 4 and 5 show two embodiments of the invention which employ this method for supplying the threshold detector 28 what is in effect peak detected video signal.

FIG. 4 shows the VHF IF signal generated by the second detector 9 being applied via a buffer amplifier 29 to a surface-acoustic-wave filter 30 that provides −6 dB roll-off in overall IF gain at video carrier as translated to VHF intermediate frequency, as well as rejection of FM sound carrier as translated to VHF intermediate frequency. The SAW filter 30 is a match filter for the vestigial sideband filtering used at the NTSC video transmitter. An example of a SAW filter exhibiting the desired type of response for video carrier translated to 45.75 MHz and sound carrier translated to 41.25 MHz is the SAF45 MVB80Z manufactured by Murata Manufacturing Co., Ltd., in Erie, Pa. The buffer amplifier 29 provides fixed gain to make up the 15–17 dB insertion loss of the SAW filter 30 and drives the SAW filter 30 from a fixed source impedance chosen to avoid unwanted reflections. The buffer amplifiers 12 and 29 preclude any interactions between the SAW filters 13 and 30 arising from being driven directly from the second detector 9 as a common source. The VHF IF band defined by the frequency-selective response of the SAW filter 30 is amplified by an amplifier 31, with an earlier one of its stages provided forward AGC in order to maintain low noise figure during reduction of its gain by AGC. At least one of the later stages of the amplifier 31 must also be provided with AGC in order to provide the AGC range required of a commercial television receiver. The AGC of a later stage of the amplifier 31 can use forward AGC or reverse AGC per standard practices in analog TV receiver design. The amplified VHF IF signal supplied by the amplifier 31 as its output signal is applied to a video detector 32 as input signal thereto.

The video detector 32 can be either a synchronous detector or an envelope detector. Or, the video detector 32 can comprise a synchronous detector for supplying composite video signal to the luminance and chrominance separation circuitry of the receiver and can further comprise an envelope detector for supplying composite video signal to the the sync separation circuitry of the receiver including a horizontal sync separator 33. The horizontal sync separator 33 supplies separated horizontal sync to automatic gain-control circuitry 34 that generates AGC signals for controlling the gains of stages in the VHF IF amplifier 31 and a delayed AGC signal for controlling the gain of the RF amplifier 2 during analog TV signal reception. The RF amplifier 2 responds to delayed AGC signal from AGC circuitry 34 during analog TV signal reception and to delayed AGC signal from AGC circuitry 18 during DTV signal reception. This can be arranged for using a pair of rectifying diodes connected to provide an analog OR circuit that selects the larger of the delayed AGC signals for controlling the gain of the RF amplifier 2 when necessary to forestall driving the first mixer 6 with an overlarge amplified RF signal. The AGC circuitry 34 follows a conventional design for an analog TV receiver, which designs typically detect the amplitude of the tips of horizontal synchronizing pulses to generate an AGC signal. In FIG. 4, however, this AGC signal is supplied to the threshold detector 28 as well as being used to control amplifier gains.

In FIG. 4 the IF amplifier chain for NTSC video carrier modulation includes the UHF IF buffer amplifier 7, the SAW filter 8, the second detector 9, the VHF IF buffer amplifier 29, the SAW filter 30 and the forward-AGC'd VHF IF amplifier 31. The IF amplifier chain for DTV modulation includes the UHF IF buffer amplifier 7, the SAW filter 8, the second detector 9, the VHF IF buffer amplifier 12, the SAW filter 13 and the reverse-AGC'd VHF IF amplifier 14.

FIG. 5 shows an alternative configuration in which the IF amplifier chain for NTSC video carrier modulation does not share the UHF IF buffer amplifier 7, the SAW filter 8 and the second mixer 11 with the IF amplifier chain for DTV modulation. Instead, the VHF IF signal for application to the buffer amplifier 29 is developed from the UHF IF signal supplied from the first detector 3 using a buffer amplifier 35, a surface-acoustic-wave filter 36 and a second mixer 37. The buffer amplifier 35 provides fixed gain to make up the 10–12 dB insertion loss of the SAW filter 36 and drives the SAW filter 36 from a fixed source impedance chosen to avoid unwanted reflections. The buffer amplifiers 7 and 35 preclude any interactions between the SAW filters 8 and 36 arising from being driven directly from the first detector 3 as a common source. The second mixer 37 receives second local oscillations from the second local oscillator 10 that also supplies the second mixer 11 with second local oscillations. The second local oscillator 10 and the second mixer 37 together form a second dector for SAW filter 36 response, downconverting that UHF IF response to a VHF IF signal for application to the buffer amplifier 29 as input signal thereto.

The SAW filter 36 provides for the −6 dB roll-off in overall IF gain at video carrier as translated to VHF intermediate frequency, as well as rejection of FM sound carrier as translated to VHF intermediate frequency. In FIG. 5 the SAW filter 36 is a match filter for the vestigial sideband filtering used at the NTSC video transmitter. So, accordingly, the SAW filter 30 used in FIG. 4 as a match filter for the vestigial sideband filtering used at the NTSC video transmitter is replaced in FIG. 5 by a SAW filter 38 that has a substantially linear-phase, flat-amplitude response over a bandwidth in excess of 6 MHz. The SAW filter 36, rather than the SAW filter 38, is preferably used for determining overall receiver response. The SAW filter 38 eliminates the image of the VHF IF signal in its response applied to the VHF IF amplifier 31 as input signal thereto.

Figure 6:
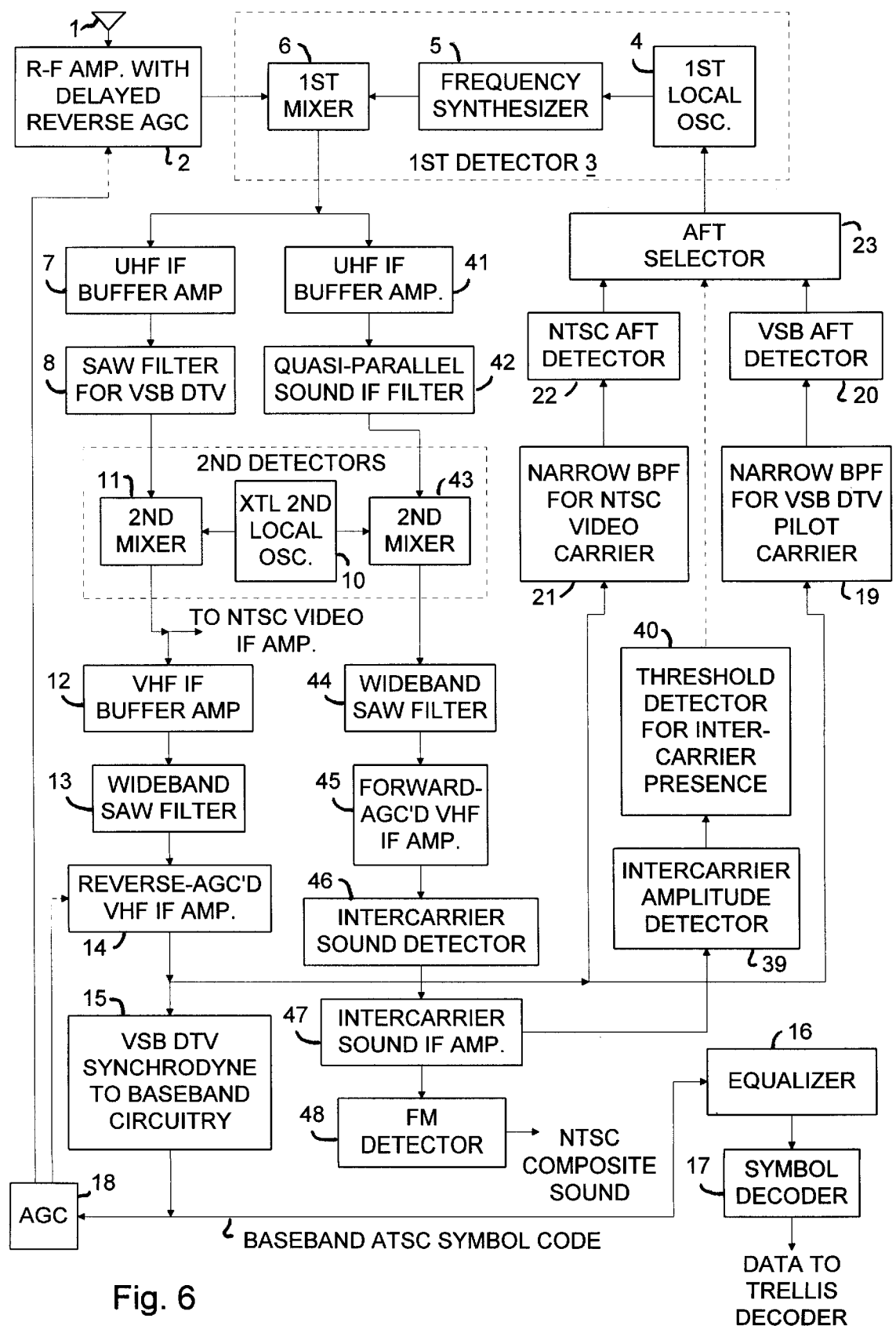
FIG. 6 shows the AFT circuitry including an AFT selector, which AFT selector selects AFT signal from an AFT detector tuned to video carrier frequency when a threshold detector senses the presence of video carrier in the response of an amplitude detector responsive to the level of intercarrier-sound intermediate-frequency signal generated from the response of a quasi-parallel sound intermediate-frequency amplifier, and which AFT selector otherwise selects AFT signal from an AFT detector tuned to DTV pilot frequency.
Figure 7:
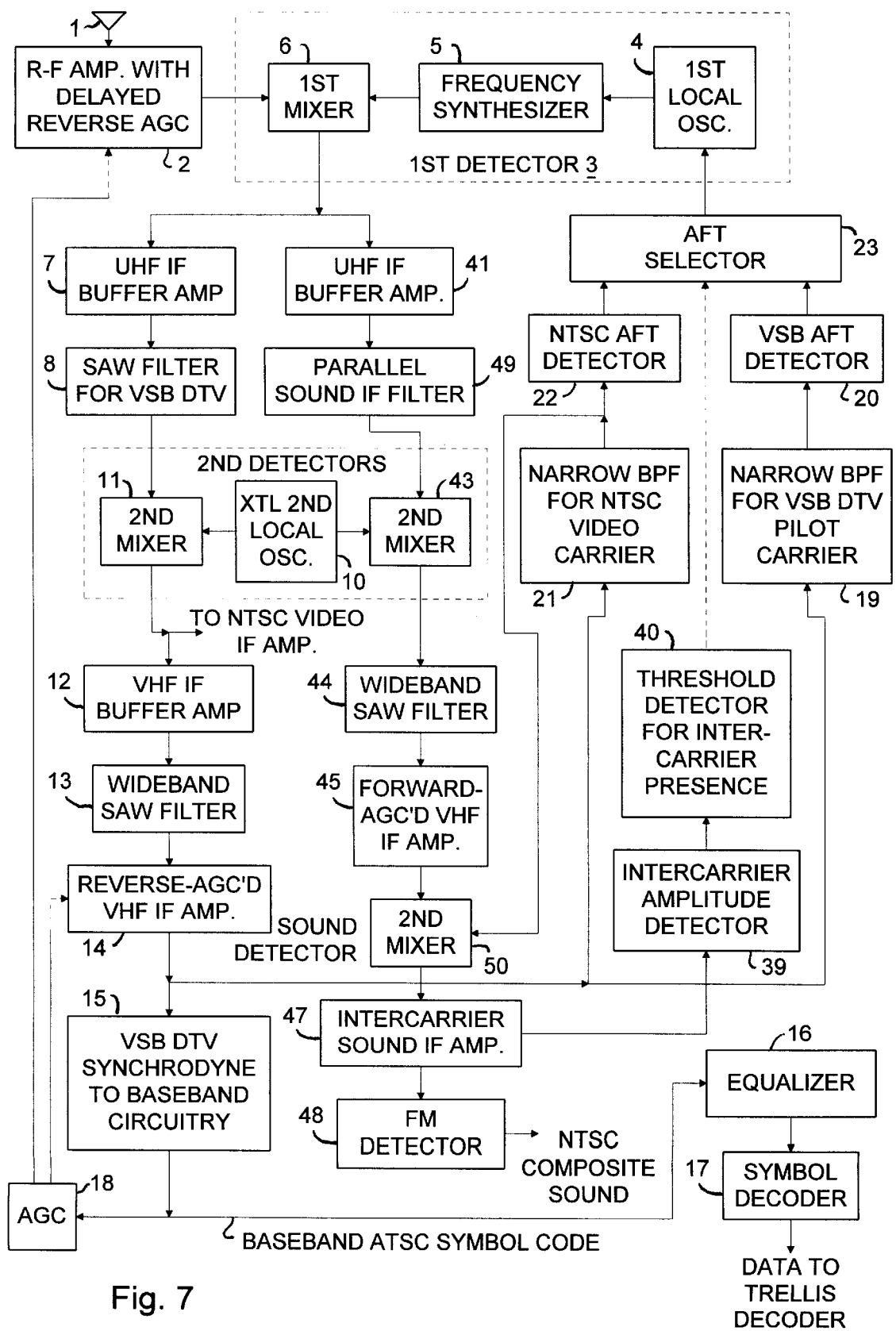
FIG. 7 shows the AFT circuitry including an AFT selector, which AFT selector selects AFT signal from an AFT detector tuned to video carrier frequency when a threshold detector senses the presence of video carrier in the response of an amplitude detector responsive to the level of intercarrier-sound intermediate-frequency signal generated from the response of a parallel sound intermediate-frequency amplifier, and which AFT selector otherwise selects AFT signal from an AFT detector tuned to DTV pilot frequency.

The second mixers 11 and 37 are preferably each of a doubly-balanced linear-multiplication type. The buffer amplifiers 12 and 29 can be replaced by respective straight-through connections, providing that the second mixers 11 and 37 are designed to drive the SAW filters 13 and 38 from source impedances that minimize multiple reflections FIGS. 6 and 7 show some of the radio receiver portions of a television receiver capable of receiving either analog TV signals or digital TV signals, with the AFT signal selector 23 being controlled by an alternative form of means for determining when the TV signal currently being received is a VSB DTV signal, which replaces the video peak detector 27 and the threshold detector 28 with an intercarrier amplitude detector 39 and a threshold detector 40. The threshold detector 40 determines the TV signal currently being received is a VSB DTV signal when the response of the intercarrier amplitude detector 39 to amplified intercarrier sound intermediate-frequency signal exceeds a prescribed threshold value.

In FIG. 6 the amplified intercarrier sound IF signal, which is a frequency-modulated 4.5 MHz signal, is developed using a quasi-parallel sound IF amplifier chain. The UHF IF signal supplied from the first detector 3 as its output signal is applied via a buffer amplifier 41 to a surface-acoustic-wave filter 42 providing a double-humped amplitude response with peaks at NTSC audio and video carriers as translated to UHF intermediate frequencies and with a saddle down 10 dB or more therebetween, as well as adjacent channel trapping. The UHF response of the SAW filter 42 is downverted to VHF IF band by a second detector comprising the second local oscillator 11 and a second mixer 43 for mutiplicatively mixing the SAW filter 42 response with second local oscillations from the second local oscillaor 11. The resulting output signal from the second mixer 43 is supplied as input signal to a surface-acoustic-wave filter 44 that has a substantially linear-phase, flat-amplitude response over a bandwidth in excess of 6 MHz. The SAW filter 44 responds to the VHF IF component of the second mixer 43 output signal and suppresses its UHF image, in supplying input signal to an amplifier 45 having automatic gain control. The amplifier 45 is preferably similar in its construction to another amplifier having automatic gain control, which other amplifier is used for supplying a video detector with amplified NTSC video carrier modulation as translated to VHF intermediate frequencies. The composite video signal reproduced by the video detector when an NTSC analog TV signal is received is used to develop AGC signals for parallel application to the amplifier 45 and to the amplifier supplying the video detector with amplified NTSC video carrier modulation. The amplified VHF IF output signal from the amplifier 45 is supplied to an intercarrier sound detector 46, which mixes the video carrier with the FM audio carrier in an exalted detection process that generates an FM 4.5 MHz intercarrier-sound intermediate-frequency signal. The intercarrier sound detector 46 is a non-linear device, such as the rectifier in a simple envelope detector, which device generates intercarrier input signal for an intercarrier sound IF amplifier 47. The intercarrier sound IF amplifier 47 supplies an amplified intercarrier sound IF signal to an FM detector 48 as input signal thereto, which input signal customarily is symmetrically limited as to peak excursions. When an NTSC analog TV signal is being received, the FM detector 48 recovers baseband composite NTSC sound signal for use in the sound processing circuitry of the TV receiver. The intercarrier sound IF amplifier 47 also supplies to the intercarrier amplitude detector 39 an amplified intercarrier sound IF signal the peak excursions of which are not limited until signal strength of the amplified intercarrier sound IF signal as detected by the intercarrier amplitude detector 39 suffices to exceed the threshold value that the threshold detector 40 requires be exceeded for determining that a received TV signal is an analog rather than a digital TV signal transmission. This can be arranged by supplying the intercarrier amplitude detector 39 amplified intercarrier sound IF signal from a stage of the intercarrier sound IF amplifier 47 preceding a final stage or two arranged to exhibit limiting of peak excursions of its response.

In FIG. 7 the amplified intercarrier sound IF signal is developed using a parallel sound IF amplifier chain. The surface-acoustic-wave filter 42 providing a double-humped amplitude response with peaks at NTSC audio and video carriers as tranlated to UHF intermediate frequencies in FIG. 6 is replaced in FIG. 7 by a surface-acoustic-wave filter 49 providing a narrowband amplitude response to the NTSC FM audio carrier as translated to UHF intermediate frequencies. In FIG. 7 the intercarrier sound detector is a third mixer 50 rather than a non-linear device as in FIG. 6. The third mixer 50 multiplicatively mixes NTSC video carrier, as translated to the VHF IF band and then selected by the narrow bandpass filter 21, with the NTSC FM audio carrier, as translated to the VHF IF band and then amplified by the amplifier 45. In variants of the FIG. 7 circuitry the third mixer 50 multiplicatively mixes NTSC video carrier, as translated to the VHF IF band in an IF amplifier chain for NTSC video signal, with the NTSC FM audio carrier, as translated to the VHF IF band and then amplified by the amplifier 45.

Frequency-modulated 4.5 MHz intercarrier signal is present in output signal from the intercarrier sound IF amplifier 47 only when NTSC analog TV signals are being received either intentionally or because of strong co-channel interference during DTV signal reception. Both the video carrier and the audio carrier of the NTSC signal must be present for intercarrier signal to be present in output signal from the intercarrier sound IF amplifier 47. Simply detecting the presence of the audio carrier of the NTSC signal in the amplified VH IF signal from the amplifier 45 for determining that the received TV signal is an NTSC analog TV signal is possible. However, this does not provide a preferred embodiment of the invention, since there is no assurance that there is in fact a video carrier present from which to develop an AFT signal. There is the possibility that the use of NTSC FM audio carrier transmissions will persist even after NTSC video carrier transmissions are discontinued, better to avoid unused spectrum.

In the claims which follow, the word "said" is used whenever reference is made to an antecedent, and the word "the" is used for grammatical purposes other than to refer back to an antecedent.

What is claimed is:

1. A radio receiver for selectively receiving one of a plurality of television signals transmitted through respective television broadcast channels, at least some of which television signals are digital television signals transmitted in accordance with a data broadcast standard by suppressed carrier vestigial sideband modulation with an unmodulated pilot carrier of the same frequency as the suppressed carrier, in which said data broadcast standard the pilot carriers of said digital television signals are at suppressed carrier frequencies substantially closer than 1.25 megahertz to limit frequencies of said television broadcast channels, said radio receiver comprising:

circuitry for selecting said television signal currently being received, which circuitry includes a first detector for generating a first detector output signal;

a first local oscillator included within said first detector, for supplying first local oscillations of adjustable frequency, which frequency can be fine-tuned responsive to an electric fine-tuning;

a first mixer included within said first detector for multiplicatively mixing said television signal currently being received with said first local oscillations to generate said first detector output signal;

an intermediate-frequency amplifier chain for supplying an amplified response to said first detector output signal, said intermediate-frequency amplifier chain having an in-channel sound trap, having an adjacent-channel sound trap and exhibiting a substantially flat amplitude response over a band extending from said in-channel sound trap past the prescribed frequency of a digital television signal pilot carrier as translated to intermediate frequency;

synchrodyining circuitry for synchrodyning said amplified response supplied by said intermediate-frequency amplifier chain to baseband when said television signal currently being received is a digital television signal, said synchrodyning circuitry being of a type for demodulating vestigial sideband modulation of the suppressed carrier of a received digital television signal to generate a baseband symbol coding signal;

symbol decoding circuitry for decoding said baseband symbol coding signal to reproduce a datastream, as transmitted in accordance with said data broadcast standard;

a bandpass carrier-selection filter providing selective response to the amplified response supplied by said intermediate-frequency amplifier chain for selecting said digital television signal pilot carrier as translated to intermediate frequency; and an automatic fine-tuning detector tuned for said digital television signal pilot carrier as translated to intermediate frequency, receptive of the selective response of said bandpass carrier-selection filter as input signal thereto and supplying an output signal therefrom which is applied as said electric fine-tuning signal to said first local oscillator included within said first detector when said television signal currently being received is a digital television signal, thereby completing a first automatic fine-tuning feedback loop.

2. A radio receiver for selectively receiving one of a plurality of television signals transmitted through respective television broadcast channels, some of which television signals are digital television signals and some of which television signals are analog television signals, said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate said first detector output signal a first intermediate-frequency amplifier chain for supplying a first amplified response to said first detector output signal said first intermediate-frequency amplifier chain having an in-channel sound trap, having an adjacent-channel sound trap and exhibiting a substantially flat amplitude response over a band extending from said in-channel sound trap past the prescribed frequency of a digital television signal pilot carrier as translated to intermediate frequency;

circuitry for synchrodyning said first amplified response supplied by said first intermediate-amplifier chain to baseband when said television signal currently being received is a digital television signal, thereby to generate a baseband symbol coding signal;

symbol decoding circuitry for decoding said baseband symbol coding signal to reproduce a transmitted datastream;

a first bandpass filter providing selective response to the amplified response supplied by said first intermediate-frequency amplifier chain for selecting said digital television signal pilot carrier as translated to intermediate frequency;

a first automatic fine-tuning detector tuned for said digital television signal pilot carrier as translated to intermediate frequency, receptive of the selective response of said first bandpass filter as input signal thereto and supplying an output signal therefrom which is applied as said electric fine-tuning signal to said first local oscillator included within said first detector when said television signal currently being received is a digital television signal, thereby completing a first automatic fine-tuning feedback loop;

a second intermediate-frequency amplifier chain for supplying a second amplified response to said first detector output signal;

video detection circuitry for detecting the amplitude of said second amplified response supplied by said second intermediate-frequency amplifier chain when said television signal currently being received is an analog television signal, thereby to generate a composite video signal;

a second bandpass filter providing selective response to the amplified response supplied by said first intermediate-frequency amplifier chain for selecting said analog television signal video carrier as translated to intermediate frequency; and a second automatic fine-tuning detector tuned for said analog television signal video carrier as translated to intermediate frequency, receptive of the selective response of said second bandpass filter as input signal thereto and supplying an output signal therefrom which is applied as said electric fine-tuning signal to said first local oscillator included within said first detector when said television signal currently being received is an analog television signal, thereby completing a second automatic fine-tuning feedback loop.

3. The radio receiver of claim 2, further comprising:

a selector for selectively applying the output signal of said first automatic fine-tuning detector to said first local oscillator as said electric fine-tuning signal as said electric fine-tuning signal when said television signal currently being received is determined to be a digital television signal and for selectively applying the output signal of said second automatic fine-tuning detector to said first local oscillator as said electric fine-tuning signal as said electric fine-tuning signal when said television signal currently being received is determined to be an analog television signal.

4. The radio receiver of claim 3, further comprising:

means for determining when said television signal currently being received is a digital television signal.

5. The radio receiver of claim 4, wherein said means for determining when said television signal currently being received is a digital television signal comprises:

an amplitude detector for detecting the amplitude of pilot carrier as translated to intermediate frequency in the selective response of said first bandpass filter; and a threshold detector responsive to the detected amplitude of pilot carrier as translated to intermediate frequency exceeding a prescribed threshold value for determining said television signal currently being received is a digital television signal.

6. The radio receiver of claim 4, wherein said means for determining when said television signal currently being received is a digital television signal comprises:

a lowpass filter for separating the direct component of said baseband symbol coding signal, which direct component responds to the amplitude of pilot carrier as translated to intermediate frequency in the amplified response supplied by said first intermediate-frequency amplifier chain; and a threshold detector responsive to the direct component of said baseband symbol coding signal, as separated by said lowpass filter, exceeding a prescribed threshold value for determining said television signal currently being received is a digital television signal.

7. The radio receiver of claim 3, further comprising:

means for determining when said television signal currently being received is an analog television signal.

8. The radio receiver of claim 7, wherein said means for determining when said television signal currently being received is an analog television signal comprises:

a video peak detector for detecting the peak amplitude of video carrier as translated to intermediate frequency in the selective response of said second bandpass filter; and a threshold detector responsive to the peak amplitude of video carrier, as detected by said video peak detector, exceeding a prescribed threshold value for determining that said television signal currently being received is an analog television signal.

9. The radio receiver of claim 7, wherein said means for determining when said television signal currently being received is an analog television signal comprises:

a sync separator for separating the horizontal synchronizing pulses of said composite video signal;

circuitry responsive to the separated horizontal synchronizing pulses for supplying a substantially direct signal indicative of their amplitude; and a threshold detector responsive to said substantially direct signal exceeding a prescribed threshold value for determining that said television signal currently being received is an analog television signal.

10. The radio receiver of claim 7, wherein said means for determining when said television signal currently being received is an analog television signal comprises:

a third intermediate-frequency amplifier chain for supplying a third amplified response to a selected portion of said first detector output signal including the audio carrier of said analog television signal;

an intercarrier detector for generating a intercarrier-sound intermediate-frequency signal by detecting the lower sideband of the result of multiplicatively mixing the audio carrier of said analog television signal from said third amplified response with the video carrier of said analog television signal from one of said first, second and third amplified responses;

an amplitude detector for detecting the amplitude of said intercarrier-sound intermediate-frequency signal; and a threshold detector responsive to the detected amplitude of said intercarrier-sound intermediate-frequency signal exceeding a prescribed threshold value for determining said television signal currently being received is an analog television signal.

11. A radio receiver for selectively receiving one of a plurality of television signals transmitted through respective television broadcast channels, at least some of which television signals are digital television signals transmitted in accordance with a data broadcast standard by suppressed carrier vestigial sideband modulation with an unmodulated pilot carrier of the same frequency as the suppressed carrier, in which said data broadcast standard the pilot carriers of said digital television signals are at suppressed carrier frequencies substantially closer than 1.25 megahertz to limit frequencies of said television broadcast channels said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate an ultra-high-frequency intermediate-frequency signal supplied as said first detector output signal;

an ultra-high-frequency intermediate-frequency amplifier providing a ultra-high-frequency intermediate-frequency amplifier output signal in frequency-selective response to said first detector output signal;

second detector for generating a second detector output signal;

a second local oscillator included within said second detector, for supplying second local oscillations of fixed frequency;

a second mixer included within said second detector for multiplicatively mixing said ultra-high-frequency intermediate-frequency amplifier output signal with said second local oscillations to generate a very-high-frequency intermediate-frequency signal supplied as said second detector output signal;

a very-high-frequency intermediate-frequency amplifier providing a very-high-frequency intermediate-frequency amplifier output signal in amplified response to said second detector output signal;

a bandpass carrier-selection filter for separating in a response thereof a pilot carrier component of said very-high-frequency intermediate-frequency amplifier output signal; and an automatic fine tuning detector responsive to the response of said bandpass carrier-selection filter for generating said electric fine-tuning signal applied to said first local oscillator for fine-tuning the frequency of said first local oscillations when said television signal currently being received is a digital television signal.

12. The radio receiver of claim 11, wherein said second local oscillator is of crystal-controlled type.

13. A radio receiver for selectively receiving one of a plurality of digital television signals transmitted through respective television broadcast channels in accordance with a data broadcast standard by suppressed carrier vestigial sideband modulation with an unmodulated pilot carrier of the same frequency as the suppressed carrier, in which said data broadcast standard the pilot carriers of said digital television signals are at suppressed carrier frequencies substantially closer than 1.25 megahertz to limit frequencies of said television broadcast, said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate an ultra-high-frequency intermediate-frequency signal supplied as said first detector output signal;

an ultra-high-frequency intermediate-frequency amplifier providing a first ultra-high-frequency intermediate-frequency amplifier output signal in frequency-selective response to said first detector output signal;

a second detector for generating a second detector output signal;

a second local oscillator included within said second detector, for supplying second local oscillations of fixed frequency;

a second mixer included within said second detector for multiplicatively mixing said ultra-high-frequency intermediate-frequency amplifier output signal with said second local oscillations to generate a very-high-frequency intermediate-frequency signal supplied as said second detector output signal;

a very-high-frequency intermediate-frequency amplifier providing a very-high-frequency intermediate-frequency amplifier output signal in amplified response to said second detector output signal;

circuitry for synchrodyning said very-high-frequency intermediate-frequency amplifier output signal to baseband when said television signal currently being received is a digital television signal, said synchrodyning circuitry being of a type for demodulating vestigial sideband modulation of the suppressed carrier of a received digital television signal to generate a baseband symbol coding signal to generate a baseband symbol coding signal;

symbol decoding circuitry for decoding said baseband symbol coding signal to reproduce a datastream, as transmitted in accordance with said data broadcast standard:

a bandpass carrier-selection filter for separating in a response thereof a pilot carrier component of said very-high-frequency intermediate-frequency amplifier output signal; and an automatic fine tuning detector responsive to the response of said bandpass carrier-selection filter for generating said electric fine-tuning signal applied to said first local oscillator for fine-tuning the frequency of said first local oscillations when said television signal currently being received is a digital television signal.

14. A radio receiver for selectively receiving one of a plurality of television signals transmitted through respective television broadcast channels, some of which television signals are digital television signals and some of which television signals are analog television signals, said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate an ultra-high-frequency intermediate-frequency signal supplied as said first detector output signal;

a first ultra-high-frequency intermediate-frequency amplifier providing a first ultra-high-frequency intermediate-frequency amplifier output signal in frequency-selective response to said first detector output signal;

a second detector for generating a second detector output signal;

a second local oscillator included within said second detector, for supplying second local oscillations of fixed frequency;

a second mixer included within said second detector for multiplicatively mixing said ultra-high-frequency intermediate-frequency amplifier output signal with said second local oscillations to generate a very-high-frequency intermediate-frequency signal supplied as said second detector output signal;

a very-high-frequency intermediate-frequency amplifier providing a very-high-frequency intermediate-frequency amplifier output signal in amplified response to said second detector output signal;

a first bandpass filter for separating in a response thereof a pilot carrier component of said very-high-frequency intermediate-frequency amplifier output signal;

a first automatic fine tuning detector responsive to the response of said first bandpass filter for generating said electric fine-tuning signal applied to said first local oscillator for fine-tuning the frequency of said first local oscillations when said television signal currently being received is a digital television signal;

circuitry for synchrodyning said very-high-frequency intermediate-frequency amplifier output signal to baseband when said television signal currently being received is a digital television signal thereby to generate a baseband symbol coding signal;

symbol decoding circuitry for decoding said baseband symbol coding signal to reproduce a transmitted datastream;

second bandpass filter for separating in a response thereof a video carrier component of said very-high-frequency intermediate-frequency amplifier output signal; and a second automatic fine tuning detector responsive to the response of said second bandpass filter for generating said electric fine-tuning signal applied to said first local oscillator for fine-tuning the frequency of said first local oscillations when said television signal currently being received is an analog television signal.

15. The radio receiver of claim 14, further comprising:

a selector for selectively applying the output signal of said first automatic fine-tuning detector to said first local oscillator as said electric fine-tuning signal as said electric fine-tuning signal when said television signal currently being received is determined to be a digital television signal and for selectively applying the output signal of said second automatic fine-tuning detector to said first local oscillator as said electric fine-tuning signal as said electric fine-tuning signal when said television signal currently being received is determined to be an analog television signal.

16. The radio receiver of claim 15, further comprising:

means for determining when said television signal currently being received is a digital television signal.

17. The radio receiver of claim 16, wherein said means for determining when said television signal currently being received is a digital television signal comprises:

an amplitude detector for detecting the amplitude of pilot carrier as translated to intermediate frequency in the selective response of said first bandpass filter; and a threshold detector responsive to the detected amplitude of pilot carrier as translated to intermediate frequency exceeding a prescribed threshold value for determining said television signal currently being received is a digital television signal.

18. The radio receiver of claim 16, wherein said means for determining when said television signal currently being received is a digital television signal comprises:

a lowpass filter for separating the direct component of said baseband symbol coding signal, which direct component responds to the amplitude of pilot carrier as translated to intermediate frequency in the amplified response supplied by said first intermediate-frequency amplifier chain; and a threshold detector responsive to the direct component of said baseband symbol coding signal, as separated by said lowpass filter, exceeding a prescribed threshold value for determining said television signal currently being received is a digital television signal.

19. The radio receiver of claim 15, further comprising:

means for determining when said television signal currently being received is an analog television signal.

20. The radio receiver of claim 19, wherein said means for determining when said television signal currently being received is an analog television signal comprises:

a video peak detector for detecting the peak amplitude of video carrier as translated to intermediate frequency in the selective response of said second bandpass filter; and a threshold detector responsive to the peak amplitude of video carrier, as detected by said video peak detector, exceeding a prescribed threshold value for determining that said television signal currently being received is an analog television signal.

21. The radio receiver of claim 19, wherein said means for determining when said television signal currently being received is an analog television signal comprises:

a sync separator for separating the horizontal synchronizing pulses of said composite video signal;

circuitry responsive to the horizontal synchronizing pulses separated by said sync separator for supplying a substantially direct signal indicative of their amplitude; and a threshold detector responsive to said substantially direct signal exceeding a prescribed threshold value for determining that said television signal currently being received is an analog television signal.

22. The radio receiver of claim 19, wherein said means for determining when said television signal currently being received is an analog television signal comprises:

a third intermediate-frequency amplifier chain for supplying a third amplified response to a selected portion of said first detector output signal including the audio carrier of said analog television signal;

an intercarrier detector for generating a intercarrier-sound intermediate-frequency signal by detecting the lower sideband of the result of multiplicatively mixing the audio carrier of said analog television signal pom said third amplified response with the video carrier of said analog television signal from one of said first, second and third amplified responses;

an amplitude detector for detecting the amplitude of said intercarrier-sound intermediate-frequency signal; and a threshold detector responsive to the detected amplitude of said intercarrier-sound intermediate-frequency signal exceeding a prescribed threshold value for determining said television signal currently being received is an analog television signal.

* * * * *